US008650456B2

(12) United States Patent
Yeo (10) Patent No.: US 8,650,456 B2
(45) Date of Patent: Feb. 11, 2014

(54) DECODER BASED DATA RECOVERY

(75) Inventor: Engling Yeo, San Jose, CA (US)

(73) Assignee: Marvell World Trade Ltd. (BB)

( * ) Notice: Subject to any disclaimer, the term of this patent is extended or adjusted under 35 U.S.C. 154(b) by 178 days.

(21) Appl. No.: 13/219,818

(22) Filed: Aug. 29, 2011

(65) Prior Publication Data

US 2012/0060074 A1 Mar. 8, 2012

Related U.S. Application Data

(60) Provisional application No. 61/380,888, filed on Sep. 8, 2010.

(51) Int. Cl.
*H03M 13/00* (2006.01)

(52) U.S. Cl.
USPC ............................ 714/758; 714/784; 714/752

(58) Field of Classification Search
USPC .......... 714/758, 752, 784, 755, 795, 791, 796
See application file for complete search history.

(56) References Cited

U.S. PATENT DOCUMENTS

| | | | |
|---|---|---|---|
| 6,694,477 B1 * | 2/2004 | Lee ................................ | 714/784 |
| 7,552,097 B2 * | 6/2009 | Richardson et al. ............ | 706/15 |
| 7,930,611 B2 * | 4/2011 | Huang et al. ................... | 714/752 |
| 8,006,172 B2 * | 8/2011 | Boyer et al. .................... | 714/786 |
| 8,132,072 B2 * | 3/2012 | El-Khamy et al. ............. | 714/755 |
| 2003/0033575 A1 * | 2/2003 | Richardson et al. ........... | 714/799 |
| 2008/0222481 A1 * | 9/2008 | Huang et al. ................... | 714/752 |

* cited by examiner

*Primary Examiner* — Fritz Alphonse (57) ABSTRACT

Systems, methods, and other embodiments associated with decoder based data recovery are described. According to one embodiment, an apparatus includes a decoder configured to perform a decoding process on codewords to verify that the codewords meet coding constraints. The decoder includes a recovery unit configured to store recovery instructions for performing a modified decoding process. The recovery unit is further configured to execute the stored recovery instructions when a decoded codeword fails to meet the coding constraints.

20 Claims, 5 Drawing Sheets

DECODER BASED DATA RECOVERY

CROSS REFERENCE TO RELATED APPLICATIONS

The present disclosure claims the benefit of U.S. Provisional Application Ser. No. 61/380,888 filed on Sep. 8, 2010, which is hereby wholly incorporated by reference.

BACKGROUND

Many data storage systems employ some type of coding system in which data being stored is combined, or encoded, with error checking information to form a codeword that meets a priori established constraints. Codewords retrieved from memory are checked against the constraints. If the codeword does not meet the constraints, iterative techniques may be used to attempt to correct the codeword. Typically, if after a certain number of iterations a valid codeword has not been recovered, the decoding process is stopped and a decoding failure is declared.

SUMMARY

In one embodiment, an apparatus includes a decoder configured to perform a decoding process on codewords to verify that the codewords meet coding constraints. The decoder includes a recovery unit configured to store recovery instructions for performing a modified decoding process. The recovery unit is further configured to execute the stored recovery instructions when a decoded codeword fails to meet the coding constraints.

In one embodiment, the decoder is a low-density parity-check decoder and rein the recovery unit is configured to store and process a recovery instruction that, when executed by the recovery unit, causes the decoder to perform additional codeword correction iterations. In one embodiment, the recovery unit is configured to store and process a recovery instruction that, when executed by the recovery unit, causes the decoder to perform additional decoding with a different set of decoding parameters. In one embodiment, the recovery unit is configured to store and process a recovery instruction that, when executed by the recovery unit, causes the decoder to adjust codeword data and decode the adjusted codeword data.

In one embodiment, the recovery unit is configured to execute the stored recovery instructions while a memory device prepares to re-read the codeword that failed to decode from a memory device. The recovery unit may be configured to abort an impending re-read of the codeword that failed to decode if the codeword is corrected during execution of the recovery instructions.

In another embodiment, a method includes detecting a codeword decoding failure and executing recovery instructions stored in a decoder. The recovery instructions modify a decoding process for a codeword. The method also includes returning results of the execution of the recovery instructions. In one embodiment, the method includes storing the recovery instructions in decoder memory prior to detecting the codeword failure. In one embodiment, the method includes receiving recovery instructions from a computing component external to the decoder if execution of the recovery instructions does not result in a valid codeword, and executing the received recovery instructions.

In one embodiment, a device includes a memory device configured to store data encoded as codewords and an encoder configured to receive and encode data according to decoding constraints and store the encoded data as codewords in the memory device. The device also includes a decoder configured to decode codewords retrieved from the memory device. The decoder includes a recovery unit configured to store recovery instructions and to execute the stored recovery instructions when a codeword decoding failure occurs. The execution of the stored recovery instructions occurs prior to a re-read of the failed codeword by the memory device.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Described herein are examples of systems, methods, and other embodiments associated with decoder based data recovery. In memory channel systems run-time constraints and trade-offs between area, throughput, power consumption, and error correction performance requirements dictate the maximum permissible on-the-fly decoding latency. For example, the processing pipeline used in magnetic storage recording begins with reading all data bits associated with a collection of bits, commonly known as a sector. A Low-Density Parity Check (LDPC) decoding may be started as soon as the entire sector is received. The decoder runs repeatedly to correct a codeword until a valid codeword is obtained, a condition requiring all coding constraints to be satisfied, or until a pre-specified decoding latency time is exceeded. If the decoder fails to find a valid codeword after reaching the maximum latency, a decoding failure is declared.

In the event of a decoding failure, the coding system can ignore the error, perform a retry procedure, and/or request a re-read or re-transmission of the codeword that failed to decode. If a re-read is requested, there is a certain amount of turnaround time while the memory reading device accesses the sector containing the codeword. The turnaround time may occur during revolution of a memory disk into position under a reading head. In one embodiment, the decoder based data recovery apparatus and methods disclosed herein enable the coding system to request a re-read of the codeword and to execute recovery instructions to retry to decode the codeword during the turnaround time for the memory reading device.

Figure 1:
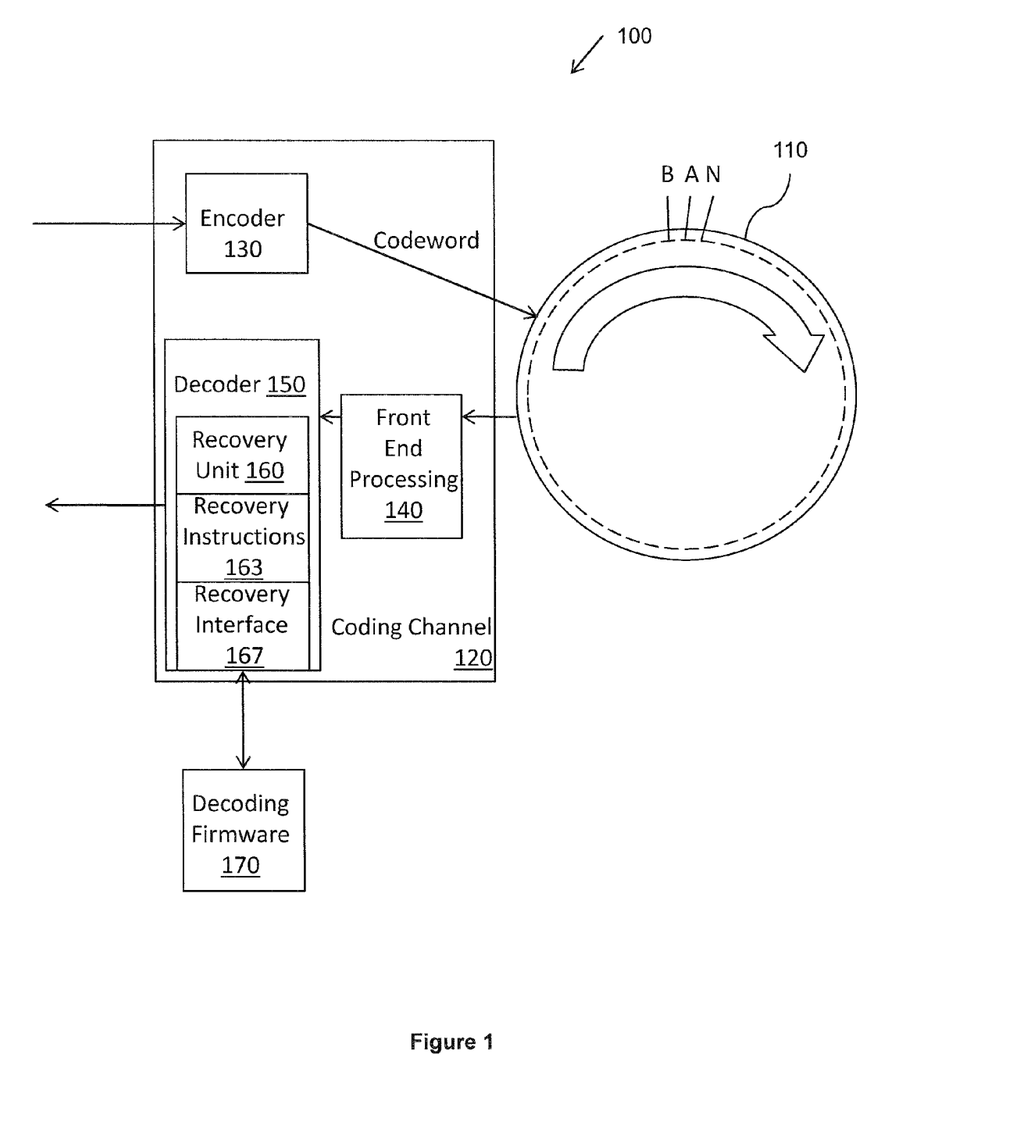
FIG. 1 illustrates one embodiment of an apparatus associated with decoder based data recovery.

Referring to FIG. 1, one embodiment of a memory coding system 100 is schematically illustrated. The coding system 100 includes a memory device 110 that stores encoded data (i.e., codewords) in memory sectors (a portion of which are labeled A-N). The memory device 110 is shown as a disk that revolves in the direction of the arrow under a reading head (not shown). The decoder based data recovery described herein can be used with any memory device that is part of a memory coding system. The coding system also includes a coding channel 120 that translates between data and codewords that encode the data that is stored on the memory device 110. An encoder 130 may use feed-forward processing to combine incoming data to be written to the memory device 110 with additional error checking information according to coding constraints to form a codeword. The codeword is stored on the memory device 110 in a sector. One example coding method that includes low-density parity-check (LDPC) coding will be described in more detail below.

When data is being read from the memory device 110 a codeword containing the requested data is transmitted to the coding channel 120. Typically some sort of front end processing 140 (e.g., filtering) is performed on the transmitted codeword and the processed codeword is input to a decoder 150. The decoder 150 checks the codeword against the coding constraints to determine if the codeword is valid (i.e., meets the coding constraints and thus is presumed to be correct). The decoder 150 may use a feed-forward decoding algorithm such as the Berlekamp-Massey algorithm, which has the capability to detect and correct errors. If the codeword does not meet the coding constraints, the decoder 150 attempts to correct the codeword so that it meets the coding constraints. Often this is an iterative process in which adjustments to the codeword are made (e.g., selective erasure or data resynchronization) and the modified codeword is checked against the coding constraints. If a valid codeword is obtained, the decoder 150 then decodes the codeword to recover the requested data. The coding channel 120 then outputs the requested data.

In one embodiment, the coding channel 120 uses LDPC coding techniques. LDPC coding is widely used in magnetic data-storage applications, wireless, wireline, and other communication applications due to its high efficiency and reliability. In LDPC coding, a bit string to be encoded is multiplied by a sparse generator matrix to produce a codeword. A codeword that is read from memory is multiplied by a sparse parity check matrix. If the result of the multiplication (called the syndrome) is zero, then the codeword is valid. If the syndrome is not zero, then the codeword is invalid and the codeword is modified by iteratively changing the value of one or more bits and checking the modified codeword against the constraints. After a certain number of iterations, if a valid codeword has not been obtained a decoding failure is declared.

Figure 2:
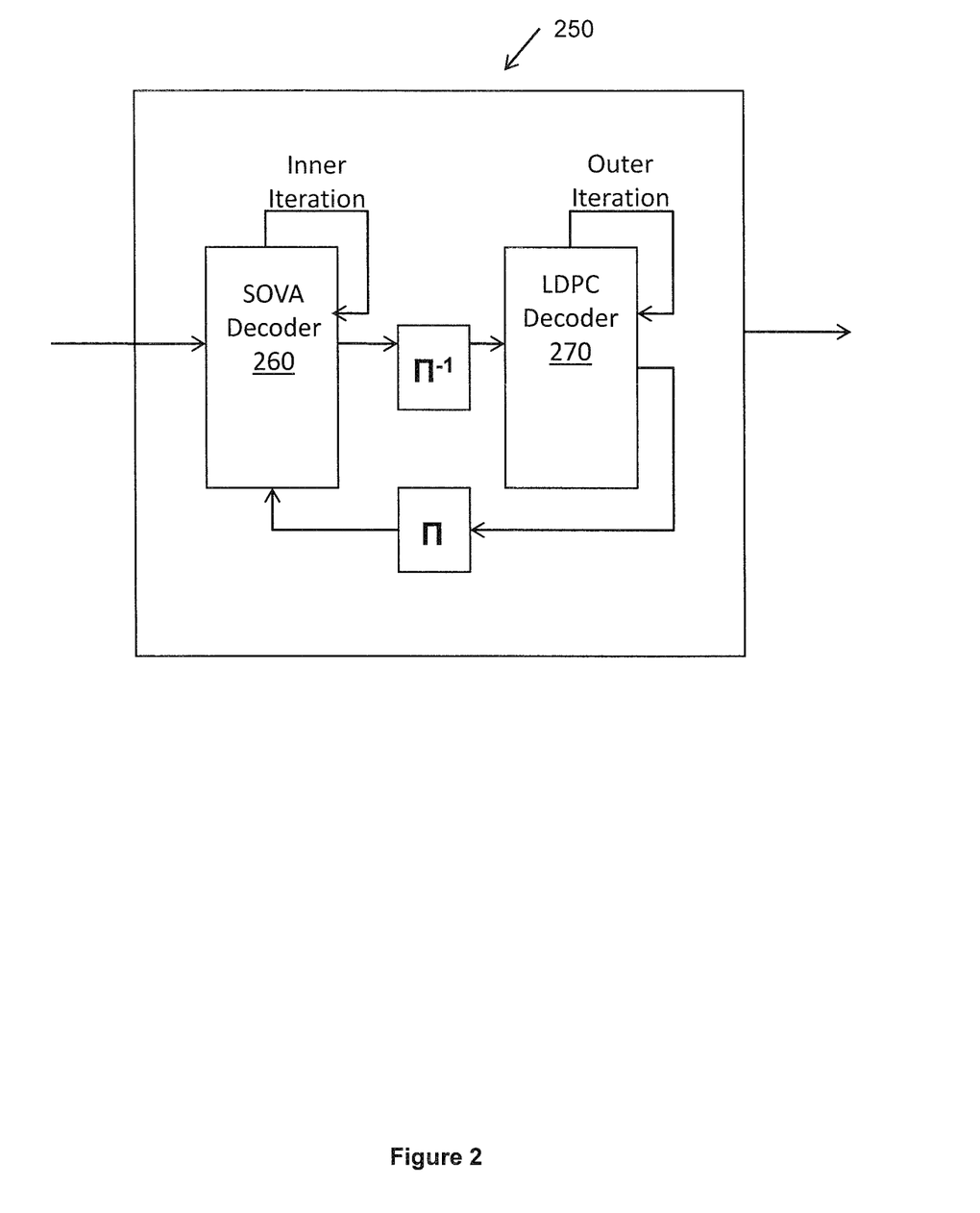
FIG. 2 illustrates one embodiment of serial concatenated decoder associated with decoder based data recovery.

In some embodiments, the decoder 150 is implemented as a serial concatenated decoder. FIG. 2 illustrates a serial concatenated decoder 250 that includes a soft output Viterbi algorithm (SOVA) channel decoder 260 that is combined with a LDPC decoder 270. The SOVA decoder provides an estimated codeword that includes a confidence level for the bits in the codeword to the LDPC decoder. The SOVA decoder 260 may perform iterations to arrive at the estimated codeword to be checked against the coding constraints and possibly corrected by the LDPC decoder 270. The SOVA decoder 260 is often referred to as the "inner" decoder while the LDPC decoder 270 is referred to as the "outer" decoder. The ratio of number of "inner iterations" performed by the SOVA decoder 260 to the number of "outer iterations" performed by the LDPC decoder 270 can affect decoding results. In one embodiment, as a default, five outer iterations are performed for each inner iteration.

Returning to FIG. 1, the decoder 150 includes a recovery unit 160 that stores a selection of recovery instructions 163 that can be performed by the decoder 150 in the event of a decoding failure. Because the recovery instructions 163 are stored in the decoder, the recovery unit 160 can execute the recovery instructions without interaction with computing components (e.g., decoder firmware 170) that are external to the decoder 150. Examples of recovery instructions will be provided with reference to FIG. 3.

In some embodiments, the recovery unit 160 is capable of executing the stored recovery instructions 163 while the memory device 110 prepares for re-reading of the codeword that failed to decode. For example, if the failed codeword was stored in sector A and the memory device 110 (i.e., disk) has already revolved to read sector B, the stored recovery instructions 163 can be executed by the recovery unit 160 while the disk revolves all the way around through sector N to position sector A for reading. The recovery unit 160 may abort the impending re-reading of the sector if the codeword is corrected during execution of the recovery instructions. The decoder 150 may be configured to have this "extended read mode" (i.e., automatic execution of recovery instructions prior to re-read of failed codeword) enabled or disabled by the user.

The recovery unit 160 also may include a recovery interface 167 configured to receive recovery instructions from a computing component external to the decoder (e.g., decoder firmware 170) and to output recovery instruction results to the computing component. The recovery interface 167 may be used to perform additional retry operations by way of instructions provided to the decoder 150 from the decoder firmware 170. The recovery interface 167 may be a diagnostic bus on which instructions may be written and results may be read. In some embodiments, the decoder is configured to enter this "retry mode" in which recovery instructions are received by way of the recovery interface automatically if a valid codeword is not obtained during the extended read mode.

Typically, retrying to decode a codeword involves a sequence of decoder register programming, signal polling, and interrupt management that requires time and programming expertise. The recovery instruction set described herein provides an interface for performing low-level programming of the decoder to retry to decode in various ways. The recovery instructions correspond to primitive operations that control fundamental decoder operations used for decoding. The recovery instructions can be seen as the parallel of assembly language to microprocessor operation. The recovery instruction set thus provides a more intuitive means for a user to perform various retry procedures without needing specialized knowledge of the inner workings of the decoder.

A selection of recovery instructions can be stored in the decoder for automatic execution by the decoder in the event of decoding failure. The stored recovery instructions can be executed by the decoder without interaction with external computing components (e.g. decoding firmware). This self-contained, decoder based approach vastly reduces the amount of time required to perform the retry. This is because a typical decoder runs at approximately ten times the speed of the communication with firmware or microprocessor that would be required to retrieve recovery instructions from these external computing components. In some embodiments, the stored recovery instructions can be started and completed in the time required for a memory disk to spin one revolution as it prepares to re-read the sector. If execution of the stored instructions results in a valid codeword, the re-read can be aborted.

Figure 3:
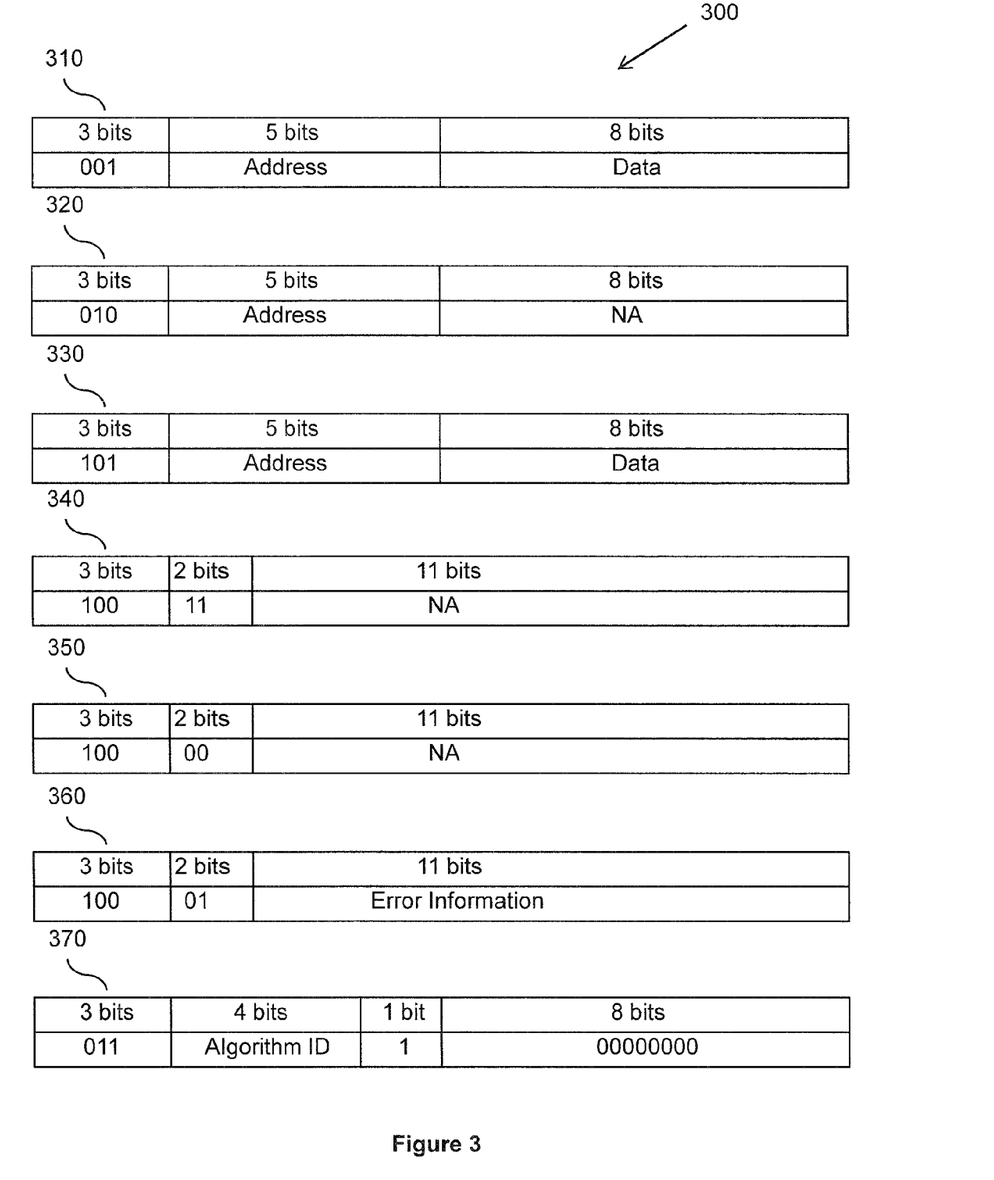
FIG. 3 illustrates one embodiment of an instruction set associated with decoder based data recovery.

FIG. 3 illustrates a general format for one embodiment of a set of recovery instructions 300 configured for a sixteen bit bus. A selection from the set recovery instructions 300 can be stored in the recovery unit for automatic performance by the decoder in the event of a decode failure. The recovery instructions may also be provided by decoder firmware external, or other computing components, to the decoder. During decoder configuration, a coding system user may select specific recovery instructions that work best in the specific environment for storage in the decoder. The user may utilize the recovery interface to provide additional recovery instructions to the decoder if execution of the recovery instructions stored in the decoder fails to produce a valid codeword. The recovery unit is configured to recognize and execute the recovery instructions input by way of the recovery interface.

The recovery instructions are used to perform additional decoding operations on a failed codeword prior to resorting to a re-read of the data from the memory device. To perform these decoding operations, the recovery instructions allow for reading and writing of register bits, performing selected decoding operations, and communicating results of the decoding instructions. A set of recovery instructions can be selected to implement any number of recovery algorithms that aim to decode a failed codeword.

The first three bits of a recovery instruction corresponds to an operation code. If the first three bits are 000, then the instruction is a no operation instruction (not shown in FIG. 3). Referring to instruction 310, a register write is designated by operation code 001, and the data in the last eight bits is written to the register whose address is contained in bits 3-7. Operation code 010, shown in instruction 320, requests a read of the register whose address is contained in bits 3-7. In response to the read request, a return instruction is provided by the decoder that is designated by operation code 101 (instruction 330). The return instruction will return the requested data in the register whose address is contained in bits 3-7 in the last eight bits. Instruction 340 (operation code 100) designates a busy state. Instruction 350 (operation code 350) designates that the recovery unit is idle. If the fourth and fifth bit are set to 01 that means that the last command did not return an error (e.g., failure to decode). Thus, instruction 350 communicates that the recovery unit has completed the recovery effort and that the codeword was successfully decoded. Instruction 360 (operation code 350) designates that the recovery unit is idle. If the fourth and fifth bits are set to 01 that means that the last command did return an error. Thus, instruction 360 communicates that the recovery unit has completed the recovery effort and that the codeword was not decoded.

Instruction 370 (operation code 011) allows selection of a recovery algorithm that is identified in bits 3-6. Bit 7 is set to 1 if the instruction is the last instruction in the recovery effort. After execution of the last instruction, the decoder registers are reset to the values they held prior to execution of a first recovery instruction. Recovery instructions can be constructed to perform a recovery algorithm including any number of operations aimed at retrying to decode a codeword. Several example instructions will now be described for illustrative purposes.

One typical recovery instruction is a "decode from memory" algorithm. This prompts the decoder to restart decoding of the cached data corresponding to the initial failed decoding. Used alone, simply decoding again from memory will not usually result in improved decoding. Therefore this instruction will often be used with other instructions that change parameters in the decoding process that will be performed during the re-decoding operation. For example, recalling the serial concatenated decoder of FIG. 2, the "decode from memory" instruction may be combined with "set outer iteration" and "set inner iteration" instructions that change the ratio of outer iterations to inner iterations. The changed dynamics that result from changing this ratio often assists an LDPC decoder to move out of a local minimal towards a codeword convergence.

Recovery instructions can include hardware primitive instructions that start a certain chain of events in the hardware. These could be instructions to restart various elements of the decoder hardware, perform diagnostic evaluation, or make adjustments to the collected data. Some the recovery instructions restart an aspect of the decoding process. Restart instructions include the "decode from memory" instruction and a "resynchronization" instruction which restarts the synchronizer and decoder. Other instructions perform diagnostic operations, for example a "calculate syndrome weight" instruction, and a "calculate syndrome" instruction. Some instructions may adjust the data being decoded, such as a "perform noise biasing" instruction and a "perform bit flipping" instruction.

Recovery instructions may also be designed to change the values of decoder parameters that are usually controlled by decoder firmware. Upon entry the retry mode the user programmable decoding parameters are registered. These parameters may be changed by the recovery instructions, but they will be restored upon exit from retry mode. This provides a quick and definitive means to switch decoding parameters back and forth between normal decoding and retry mode decoding. Some examples of parameters that can be changed include: the number of inner or outer iterations, data scaling factors, data saturation limits, and threshold values used for diagnostics. The recovery instruction set also defines a response that indicates the various states of the decoder hardware as it reacts to and completes each instruction. Firmware can poll the recovery interface (e.g., diagnostic bus) as it waits for an indication on what instruction to issue next.

Figure 4:
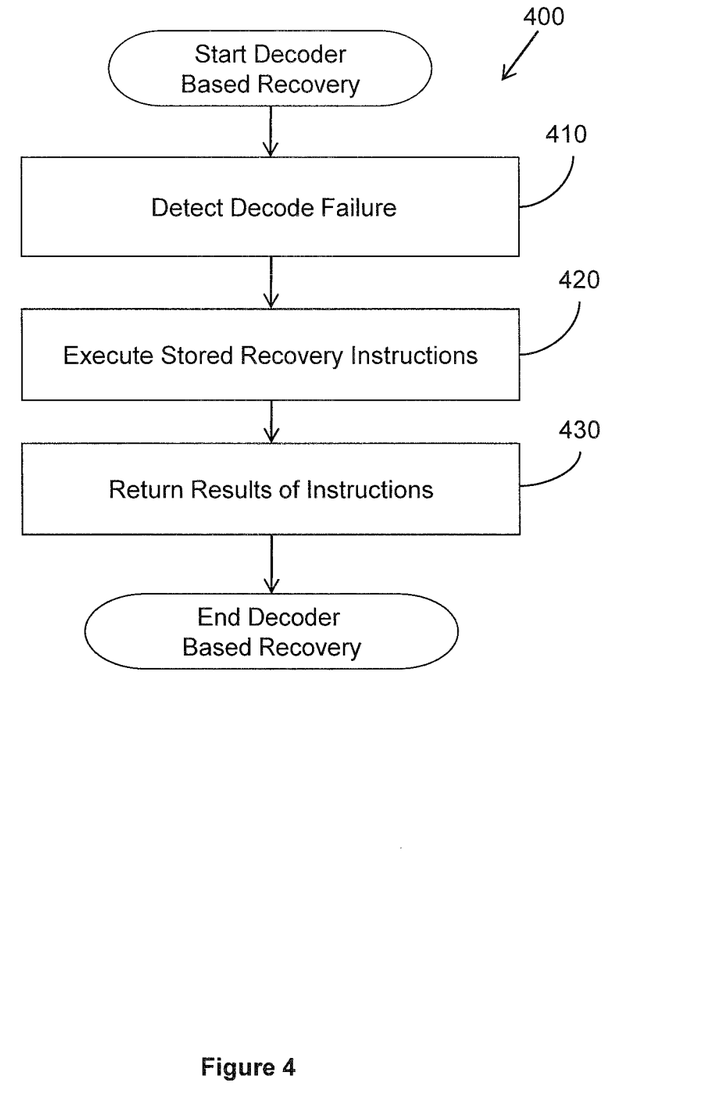
FIG. 4 illustrates one embodiment of a method associated with decoder based data recovery.
Figure 5:
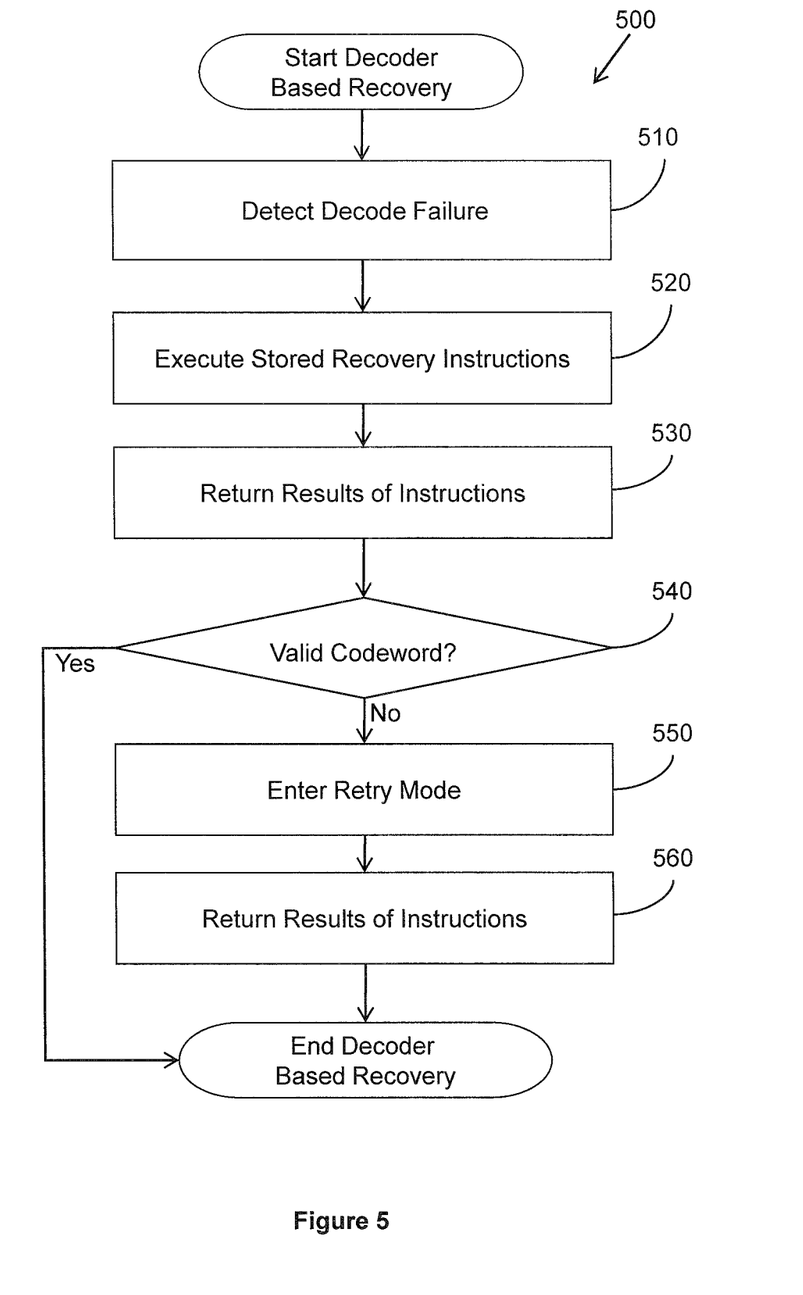
FIG. 5 illustrates one embodiment of a method associated with decoder based data recovery.

FIG. 4 is a flow diagram outlining one embodiment of a decoder based recovery method 400. At 410, the method includes detecting a codeword decoding failure. At 420, the method includes executing recovery instructions stored in a decoder. At 430, the method includes returning results of the execution of the recovery instructions. The method 400 may also include storing the recovery instructions in the decoder during decoder configuration. The decoder based recovery method 400 maybe performed by a decoder during preparations to re-read the codeword without interaction with computing components external to the decoder FIG. 5 is a flow diagram outlining one embodiment of a decoder based recovery method 500. At 510, the method includes detecting a codeword decoding failure. At 520, the method includes executing recovery instructions stored in a decoder. At 530, the method includes returning results of the execution of the recovery instructions. At 540, the method includes determining if a valid codeword has been obtained and if a valid codeword has been obtained, the method 500 ends. If a valid codeword has not been obtained, at 550, the method includes entering a retry mode in which recovery instructions are received from a computing component external to the decoder and executed by the decoder. At 560, the method includes returning results of the execution of the recovery instructions.

In the methods 400 and 500, the recovery instructions may cause the decoder to perform additional correction iterations on the codeword. The recovery instructions may cause the decoder to perform diagnostic procedures on the codeword. The recovery instructions may cause the decoder to adjust codeword data and decode the adjusted codeword data. The recovery instructions may cause the decoder to adjust decoder parameters. The recovery instructions may cause the decoder to output a response that communicates decoder status to computing components external to the decoder.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

While for purposes of simplicity of explanation, illustrated methodologies are shown and described as a series of blocks. The methodologies are not limited by the order of the blocks as some blocks can occur in different orders and/or concurrently with other blocks from that shown and described. Moreover, less than all the illustrated blocks may be used to implement a methodology. Blocks may be combined or separated into multiple components. Furthermore, additional and/or alternative methodologies can employ additional, not illustrated blocks.

To the extent that the term "includes" or "including" is employed in the detailed description or the claims, it is intended to be inclusive in a manner similar to the term "comprising" as that term is interpreted when employed as a transitional word in a claim.

While examples of systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the disclosure is not limited to the specific details, the representative apparatus, and illustrative examples shown and described. Thus, this application is intended to embrace alterations, modifications, and variations that fall within the scope of the appended claims.

What is claimed is:

1. An apparatus, comprising:
    a decoder configured to perform a decoding process on codewords to verify that the codewords meet coding constraints; and
    wherein the decoder comprises a recovery unit configured to store recovery instructions for performing a modified decoding process, wherein the decoder is further configured to perform the modified decoding process by executing the stored recovery instructions when a decoded codeword fails to meet the coding constraints.

2. The apparatus of claim 1, wherein the recovery instructions are stored on the decoder prior to performing the decoding process on the codeword.

3. The apparatus of claim 1, wherein the recovery unit further comprises a recovery interface configured to receive recovery instructions from a computing component external to the decoder and to output recovery instruction results to the computing component.

4. The apparatus of claim 1, wherein the decoder comprises a low-density parity-check decoder and further wherein the recovery unit is configured to store and process a recovery instruction that, when executed by the decoder, causes the decoder to perform additional codeword correction iterations.

5. The apparatus of claim 1, wherein the decoder comprises a low-density parity-check decoder and further wherein the recovery unit is configured to store and process a recovery instruction that, when executed by the decoder, causes the decoder to perform additional decoding with a different set of decoding parameters.

6. The apparatus of claim 1, wherein the decoder comprises a low-density parity-check decoder and further wherein the recovery unit is configured to store and process a recovery instruction that, when executed by the decoder, causes the decoder to adjust codeword data and decode the adjusted codeword data.

7. The apparatus of claim 1, wherein the recovery unit is configured to execute the stored recovery instructions while a memory device prepares to re-read the codeword that failed to decode from a storage medium.

8. The apparatus of claim 1, wherein the recovery unit is configured to abort an impending re-read of the codeword that failed to decode if the codeword is corrected during execution of the recovery instructions.

9. A method, comprising:
    decoding a codeword with a decoder according to a decoding process;
    detecting a codeword decoding failure;
    executing, with the decoder, recovery instructions stored in the decoder,
        wherein the recovery instructions modify the decoding process; and
    returning results of the execution of the recovery instructions.

10. The method of claim 9, further comprising storing the recovery instructions in decoder memory prior to detecting the codeword failure.

11. The method of claim 9, further comprising receiving recovery instructions from a computing component external to the decoder if execution of the recovery instructions does not result in a valid codeword, and executing the received recovery instructions.

12. The method of claim 9, wherein executing the recovery instructions comprises performing additional correction iterations on the codeword.

13. The method of claim 9, wherein executing the recovery instructions comprises performing diagnostic procedures on the codeword.

14. The method of claim 9, wherein executing the recovery instructions comprises adjusting the codeword and decoding the adjusted codeword.

15. The method of claim 9, wherein executing the recovery instructions comprises adjusting decoder parameters.

16. The method of claim 9, wherein executing the recovery instructions comprises outputting a response that communicates decoder status to computing components external to the decoder.

17. A device comprising:
    a memory device configured to store data encoded as codewords;
    an encoder configured to receive and encode data according to decoding constraints and store the encoded data as codewords in the memory device;
    a decoder configured to decode codewords retrieved from the memory device; and
    wherein the decoder comprises a recovery unit configured to store recovery instructions and to execute the stored recovery instructions when a codeword decoding failure occurs, and further wherein the execution of the stored recovery instructions occurs prior to a re-read of the failed codeword by the memory device.

18. The device of claim 17, wherein the recovery unit further comprises a recovery interface configured to receive recovery instructions from a computing component external to the decoder and to output recovery instruction results to the computing component.

19. The device of claim 17, wherein the decoder comprises a low-density parity-check decoder and further wherein the recovery unit is configured to store and process a recovery instruction that, when executed by the recovery unit, causes the decoder to perform additional codeword correction iterations.

20. The device of claim 17, wherein the decoder executes the recovery instructions.

* * * * *